(12) United States Patent
Macbeth et al.

(10) Patent No.: US 6,362,628 B2
(45) Date of Patent: Mar. 26, 2002

(54) ARC FAULT CIRCUIT DETECTOR DEVICE DETECTING PULSE WIDTH MODULATION OF ARC NOISE

(75) Inventors: Bruce F. Macbeth; Thomas N. Packard, both of Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 09/295,219

(22) Filed: Apr. 21, 1999

Related U.S. Application Data (60) Provisional application No. 60/113,241, filed on Dec. 21, 1998.

(51) Int. Cl.$^7$ .............................................. G01R 31/08
(52) U.S. Cl. ..................................................... 324/536
(58) Field of Search ................................ 324/536, 509, 324/508, 514

(56) References Cited

U.S. PATENT DOCUMENTS 6,072,317 A * 6/2000 Mackenzie .................. 324/536

* cited by examiner

Primary Examiner—Glenn W. Brown
Assistant Examiner—J Kerveros (74) Attorney, Agent, or Firm—Wall Marjama & Bilinski, LLP (57) ABSTRACT

An arc fault detecting circuit using a pulse width modulation, or PWM, technique is used to sense series or parallel arc faults. When arc faults occur, typically an arc step in current is followed by broad band arc noise which is caused by the random fluctuations in arc column resistance. In this invention, a logic signal is created which has a duration or width that corresponds to the time interval during which the broad band arc noise generated by the arc is present. Typically an arc fault randomly starts, generates broad band arc noise, and then extinguishes as the next current zero cross of the AC load current is approached. The random start causes PWM of the logic pulse whenever the start of the arc randomly moves with respect to the current zero cross. An arc fault that randomly starts, and then randomly stops, will also cause PWM with respect to the zero cross. The PWM logic pulse is coupled to the input of a microprocessor which measures and stores the length of the present PWM pulse under measurement, and compares that pulse to the pulse length of the last stored PWM pulse, and increments a counter if the difference in pulse length is greater than a predetermined amount. When the counter number is greater than or equal to a predetermined number held in the microprocessor memory, an output signal is sent to a controller which activates the circuit interrupter. Another input to the microprocessor, corresponding to the magnitude of the arc current, is used to adjust the predetermined number value down or up depending on the intensity of the arc fault for faster or slower interrupts respectively.

12 Claims, 6 Drawing Sheets

ARC FAULT CIRCUIT DETECTOR DEVICE DETECTING PULSE WIDTH MODULATION OF ARC NOISE

This appln claims benefit of Prov. No. 60/113,241 filed Dec. 21, 1998.

FIELD OF THE INVENTION

This invention relates generally to are fault circuit interrupters, and more particularly to an arc fault circuit interrupter that uses the random start time and/or the duration of arc noise to detect the presence of arcing.

BACKGROUND OF THE INVENTION

The demand for arc fault circuit interrupters that reliably detect the presence of actual arcs, while discriminating against similar phenomena such as the noise created by lamp dimmers, motor operated appliances and the like, is high. Arc fault circuit interrupters have application in circuit breakers to protect possibly long electrical circuits powering a number of devices, as well as in wiring devices such as receptacles to protect a single device or appliance. Especially in the case of wiring devices, the complexity and therefore the cost of an arc fault circuit interrupter is an important consideration. Simple are fault circuit interrupters that can be manufactured at a reasonable cost are likely to be much more widely used than more expensive designs.

We have observed that one characteristic of the noise produced by arcs is that the width of the noise pulses varies from cycle to cycle. This characteristic distinguishes actual arc noise from the noise produced by devices such as lamp dimmers, which are far more regular.

We have found that by comparing the lengths of successive noise pulses on a power line, and generating a fault when a predetermined number of pairs of unequal length pulses is detected, arc faults can be reliably detected, even in the presence of other noise producing, phenomena.

SUMMARY OF THE INVENTION

It is an object of this invention to provide an arc fault circuit interrupter that employs an electrical circuit that is simple enough, inexpensive enough and small enough to be included in wiring devices. It is another object of this invention to provide an arc fault circuit interrupter that is sensitive to arc faults, but resistant to false tripping, due to noise created by lamp dimmers and the like.

It is another object of this invention to provide an arc fault circuit interrupter that is sensitive to relatively low amplitude series arc faults of at least 5 amps of arc current, typically in series with the load and commonly referred to as Type A arc faults.

It is another object of this invention to provide an arc fault circuit interrupter that detects parallel or line to line arcs, producing currents of 75 amps or more, commonly referred to as Type B arc faults.

Briefly stated, and in accordance with a presently preferred embodiment of the invention, an arc fault detecting circuit using a pulse width modulation, or PWM, technique is used to sense series or parallel arc faults. When are faults occur, typically an arc step in current is followed by broad band arc noise which is caused by the random fluctuations in arc column resistance. In this invention, a logic signal is created which has a duration or width that corresponds to the time interval during which the broad band arc noise generated by the are is present. Typically an arc fault randomly starts, generates broad band arc noise, and then extinguishes as the next current zero cross of the AC load current is approached. The random start causes PWM of the logic pulse whenever the start of the arc randomly moves with respect to the current zero cross. An arc fault that randomly starts, and then randomly stops, will also cause PWM with respect to the zero cross. The PWM logic pulse is coupled to the input of a microprocessor which measures and stores the length of the present PWM pulse under measurement, and compares that pulse to the pulse length of the last stored PWM pulse, and increments a counter if the difference in pulse length is greater than a predetermined amount. When the counter number is greater than or equal to a predetermined number held in the microprocessor memory, an output signal is sent to a controller which activates the circuit interrupter.

Another input to the microprocessor, corresponding to the magnitude of the arc fault current broadband noise, is used to adjust the predetermined number value down or up depending on the intensity of the arc fault for faster or slower interrupts respectively.

This invention also provides discrimination against the noise produced by light dimmers, Power Line Carrier transmissions signals, motor noise, and similar phenomenon. Light dimmers do not produce arc noise, nor is there PWM of the conduction period, which stays essentially constant from half cycle to half cycle, and this type of signal is rejected by the present device. Power Line Carrier signals, or PLC, are rejected by the RF bandpass filter, by the bandpass below the frequency band of PLC transmissions and above the typical 60 HZ line current harmonics. PLC is also rejected by the nature of the typical PLC envelope signal which is not pulse width modulated. Motor brush noise is typically synchronous with the power line frequency and does not contain any pulse modulation of the motor noise interval and is also rejected by this invention. Motor noise is also typically of a lower magnitude than arc fault noise, which also aids in the rejection of motor noise.

BRIEF DESCRIPTION OF THE DRAWINGS

The novel aspects of the invention are set forth with particularity in the appended claims. The invention itself together with further objects and advantages thereof may be more readily comprehended by reference to the following detailed description of a presently preferred embodiment of the invention taken in conjunction with the accompanying drawings, in which:

DESCRIPTION OF THE PREFERRED EMBODIMENT

This invention is intended for incorporation into a receptacle, plug, or cord type device and employs some of the approaches used in ground fault interrupter devices shown in U.S. Pat. Nos. 5,594,358, and 5,510,760.

Figure 1:
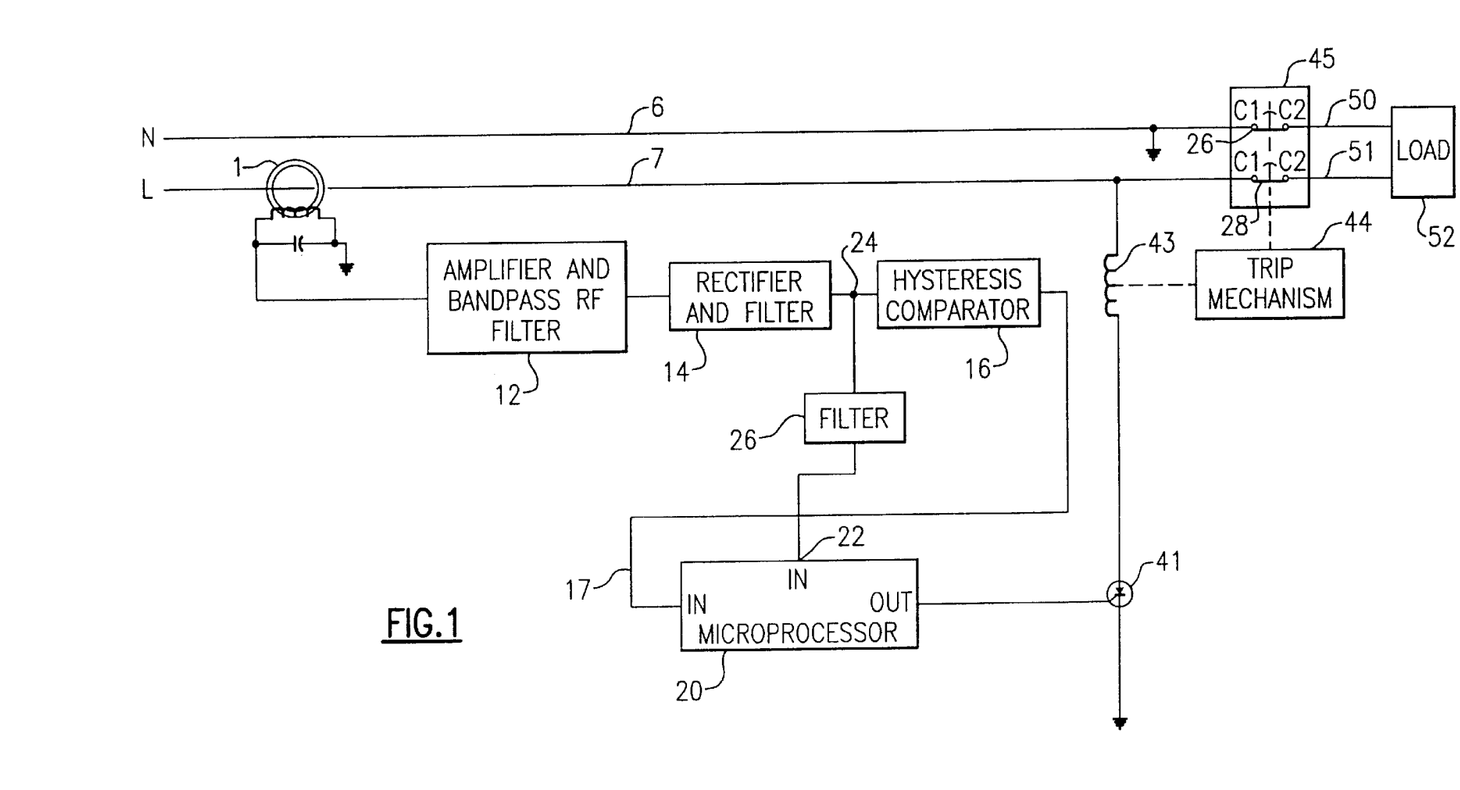
FIG. 1 is a schematic diagram of the arc fault circuit interrupter using a microprocessor based PWM arc noise detection method.

Referring now to FIG. 1, an electrical power line includes a neutral conductor 50, and line conductor 51, which are both protected by a contact mechanism 45. Contact mechanism 45 is a spring loaded mouse trap type device, which is controlled by a trip mechanism 44. Conduction of an SCR 41 activates solenoid 43 which activates the trip mechanism 44. When the trip mechanism is activated, the spring loaded contacts 26 and 28 latch open, disconnecting the load 52 from the power source and stay open until a manual reset has occurred.

Current transformer 1 senses the current in line conductor 7 and produces a signal in response to an arc fault. The arc fault signal contains rate of change of current, or di/dt, pulses, in response to the step change in current at the beginning and at the end of the arc. The arc fault signal also contains broad band arc noise which occurs during the arc. The di/dt pulses are typically of a much higher amplitude than the broad band arc noise. From the output of current transformer 1, the arc signal is amplified and bandpass filtered by amplifier and bandpass rf filter 12 in a pass band from approximately 6 khz to 15 khz, which passband is set below the typical frequency band of power line carrier signals and above the typical 60 HZ power line harmonics. From the output of amp. & bp rf fil. 12, the signal is rectified and filtered by rectifier and filter 14 and then applied to hysteresis comparator 16. The hysteresis prevents the comparators output from repeatedly switching, which is commonly known as hunting, when a dc signal with a superimposed ac signal nears the comparator threshold and repeatedly passes through the threshold. The output of 16 is a pulse width modulated (PWM) logic signal which is coupled to an input 17 of detector microprocessor 20. The microprocessor 20 is programmed to repeatedly measure and store the time interval of the PWM pulse under measurement, and compares the measured interval to the time interval of the last PWM pulse stored in microprocessor 20 and increments a software counter if the difference in length of PWM pulse under measurement and the last stored PWM pulse, is greater than a predetermined value. When the software counter value is greater than or equal to a predetermined trip value held in a memory register, an output arc fault detection signal is generated and sent to a controller SCR 41 which activates the circuit interrupter.

The output of rectifier and filter 14 is also connected through filter 26 to microprocessor input 22. Input 22 is an analog to digital conversion port which converts the magnitude of the rectified arc noise voltage appearing at node 24, after additional filtering in low pass filter 26, into a binary number. The binary number is used to increase the counters predetermined trip value, if the amplitude of the noise generated by the arc fault after being passband filtered and rectified is low, and to decrease the predetermined trip value if the amplitude of the noise is high. In this way, a high level arc fault current which causes high level arc fault noise will cause the microprocessor to lower the counters predetermined trip value in order to decrease the time required to interrupt the arc. Similarly, a low intensity arc causes the micro to adjust upwards the predetermined trip value, allowing low level arc faults to occur for a longer period of time before circuit interruption. A longer period is required for differentiation between low level arc faults and legitimate load signals, which may mimic arcing faults.

The microprocessor is also programmed to reset the software counter at a predetermined time after the first PWM count, the predetermined time being greater than any arc fault detection period required for speedy circuit interruption. Resetting the software counter eliminates any accumulation of PWM software counts which may occur from spurious sources such as load switching and other normal load phenomenon.

Figure 2:
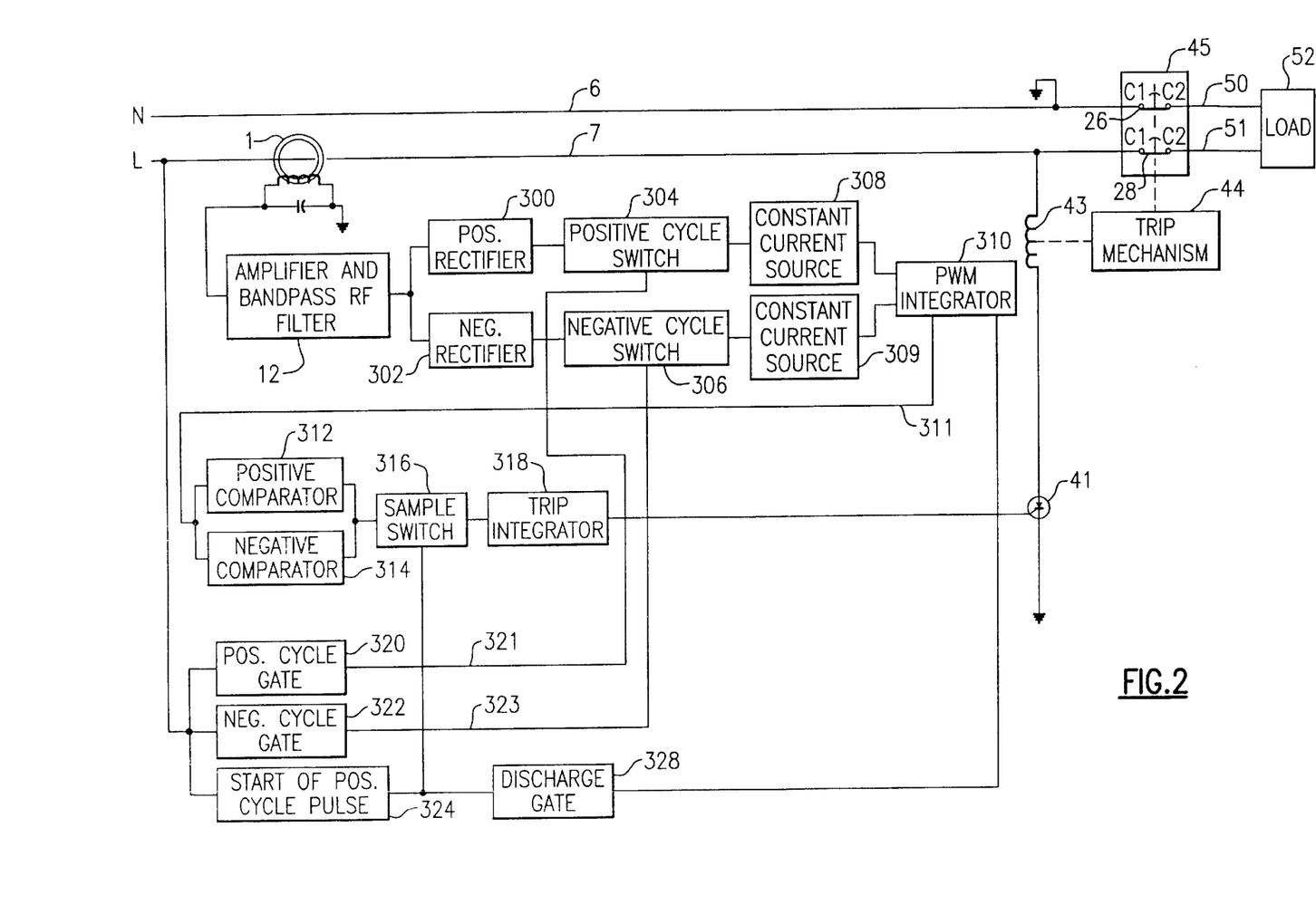
FIG. 2 is a block diagram of the arc fault interrupter using an analog implementation of PWM arc noise detection.

An analog implementation of apparatus in accordance with this invention for PWM detection of arc faults is illustrated in FIG. 2. The identical function blocks as used in FIG. 1 are numbered the same in FIG. 2. An arc fault signal containing broad band arc fault noise is sensed by current transformer 1 and amplified and band passed filtered by block 12, at which point the signal processing diverges from the schematic of FIG. 1. The signal at the output of amplifier and band pass filter 12 contains band passed filtered arc noise centered around zero volts. The positive portion of the filtered arc noise is rectified by rectifier block 300, the negative portion of the filtered arc noise is rectified by rectifier block 302. Positive cycle gate 320, connected to line conductor 7, senses the power line voltage and produces a logic high output pulse at output 321 having a duration approximately equal to the duration of the positive voltage cycle. In the same manner, negative cycle gate 322 produces a logic high output pulse at output 323 for the approximate duration of the negative line voltage cycle. During the positive period of line voltage, output 321 of positive cycle gate 320 enables positive cycle switch 304 to conduct the positive rectified arc noise at the output of positive rectifier 300 into constant source 308 and then into PWM integrator 310. The PWM integrator 310 stores a charge proportional to the positive rectified arc noise during the positive line voltage period. During the negative portion of the line voltage cycle, negative cycle switch 306 is enabled by negative cycle gate output 323, and in a similar way to the positive voltage cycle, causes the negative rectified arc noise to be conducted to constant current source 309, and charge PWM integrator 310 in the negative direction. In this way, arc fault noise voltage occurring during the negative line voltage cycle will cause remove charge accumulated by action of the positive cycle arc noise. If both conduction periods are of the same length and of the same intensity then the net charge stored by PWM integrator 310 over a full cycle will be zero. Any variation between the length of the arc fault noise, and the arc fault noise intensity, between the successive positive and negative line voltage cycles will leave a net charge in PWM integrator 310 and produce a positive or negative output at 311 having a magnitude proportional to the variation. At the beginning of each positive cycle, a pulse generator 324 enables sample switch 316. If the voltage across the PWM integrator 310, caused by any stored charge, exceeds the voltage reference levels of either of positive and negative comparators 312 and 314 respectively, one of the comparators 312 or 314 will produce an output. The comparator output is connected to the trip integrator 318 via the sample switch 316. After each sample period, which occurs for a brief interval after the start of each positive cycle, a discharge gate 328, is activated on the falling edge of the start of positive cycle pulse generator 324, and discharges the PWM integrator 310, preparing the integrator for the next line cycle. Both the sample action and then discharge action arc designed to act fast enough to occur before the start of the next arc fault step. Although this embodiment uses the voltage as a power line zero cross reference for the PWM switching and charging system, a sample of the current waveform could be used for these same functions.

After a succession of PWM arc noise samples that exceed a predetermined width variation, which cause switching of one of comparators 312 or 314, by way of left over charge in integrator 310, trip integrator 318 will charge to a level which will cause circuit interrupter SCR 41 to trigger into conduction, causing interruption of the arc fault.

Figure 3:
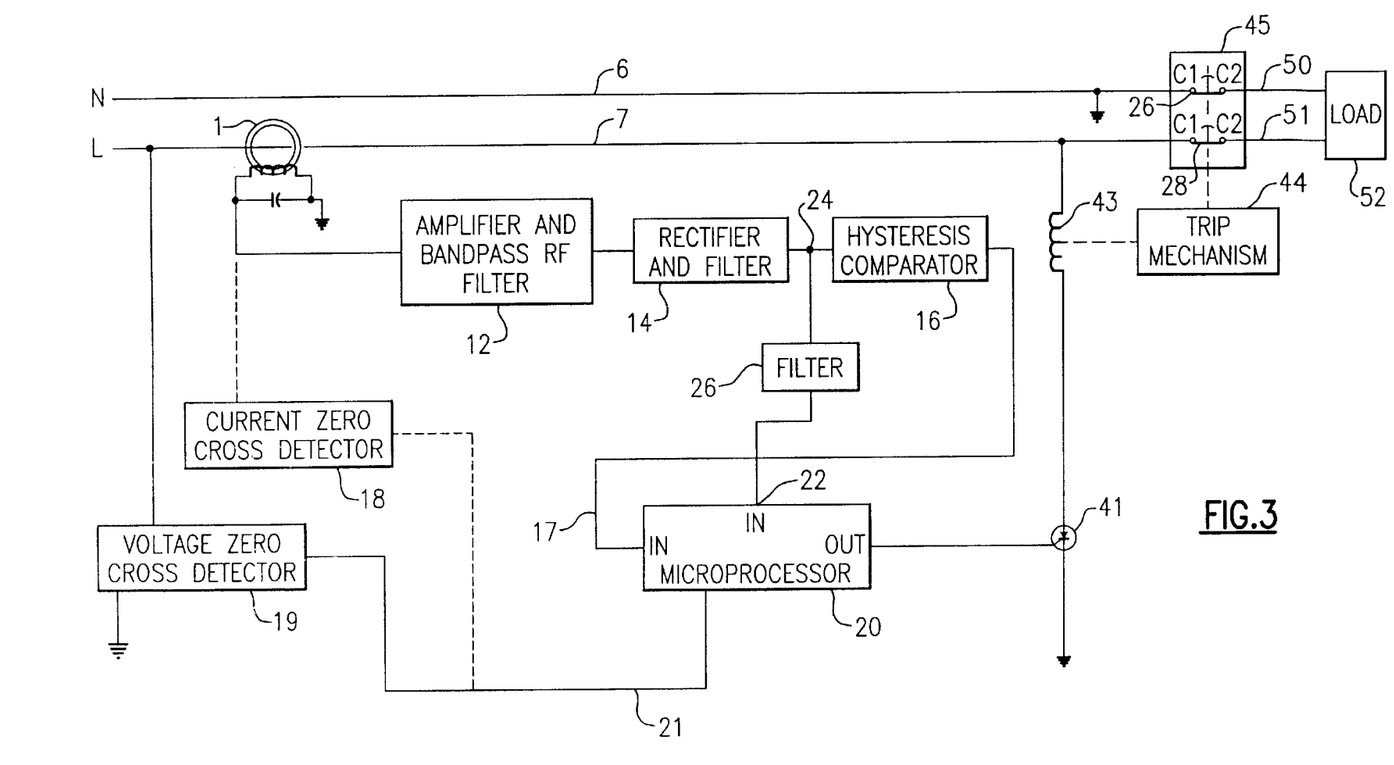
FIG. 3 is a block diagram of the arc fault circuit interrupter using a microprocessor based PPM arc noise detection method.

In another embodiment, used for pulse position modulation arc fault detection, or PPM, illustrated in FIG. 3, an additional line voltage zero cross detector 19 connected to line conductor 7, produces pulses at each zero cross. The zero cross pulses are connected to input 21 of microprocessor 20. The voltage zero cross pulses permits the microprocessor to measure the time between the voltage zero cross and the rising edge of the PWM logic pulse. When the start of the arc fault randomly moves with respect to the voltage zero cross pulse, which acts as the time reference, pulse position modulation occurs. In a manner similar to the PWM detection embodiment, microprocessor 20 measures and stores the time interval between the voltage zero cross pulse and the leading edge of the arc fault logic signal coupled to micro input, for a present noise pulse, and compares the present PPM interval to the time interval of a stored PPM interval for a previous noise pulse. The software counter is then incremented if the difference in time interval between the of PPM interval under measurement and the last stored PPM interval, is greater than a predetermined time interval. FIG. 3 also shows a current zero cross detector 18 connected to sensor 1. The current zero cross detector may be substituted for the voltage zero cross detector 19 in the PPM embodiment and produce the same detection results. All else is the same as the PWM using the microprocessor embodiment.

Figure 4:
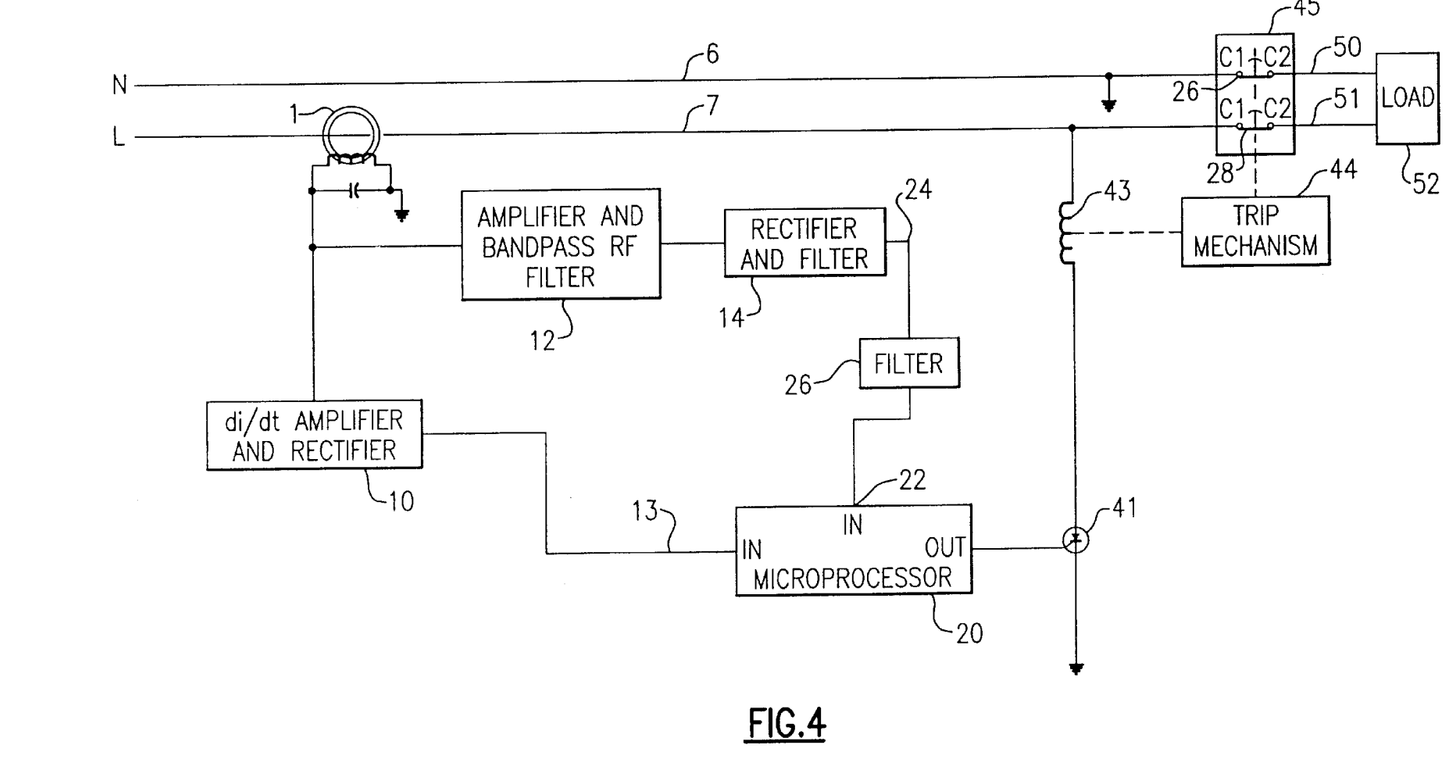
FIG. 4 is a block diagram of the arc fault interrupter using the PPM of the di/dt of the arc fault steps for detection.

In a further embodiment of the PPM detection method, illustrated in FIG. 4, an input 13 of microprocessor 20 is connected to an arc fault step detector 10 which outputs a di/dt pulse each time an arc fault step is produced. The microprocessor 20 measures and stores the time interval between the voltage zero cross pulse and the randomly occurring di/dt pulse occurring at micro input 13 for a present pulse, and compares the present pulse interval to the time interval of the last stored pulse. All else is the same as the first PPM embodiment.

Figure 5:
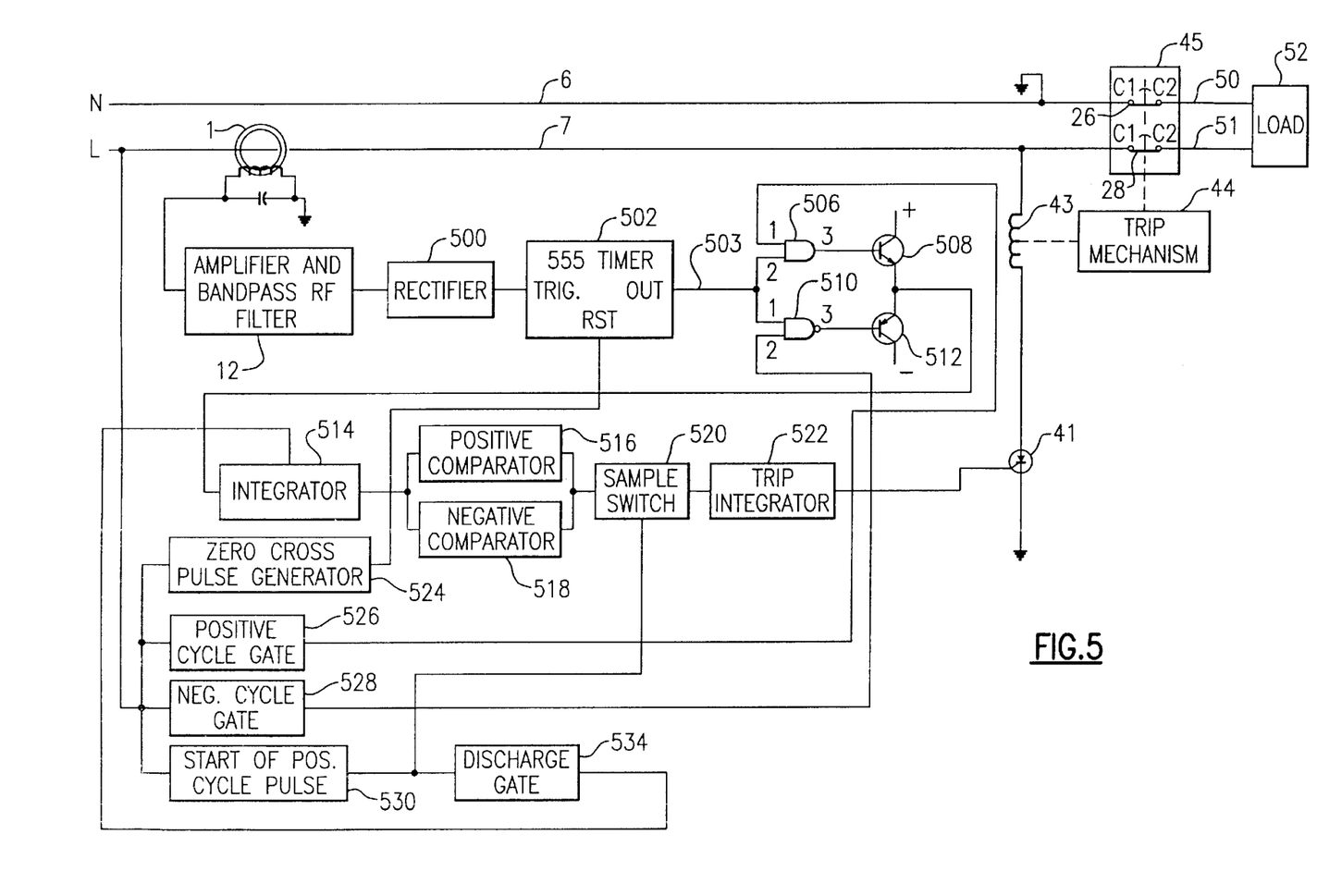
FIG. 5 illustrates an analog block diagram for the implementation of PPM arc fault detection.
Figure 6A:
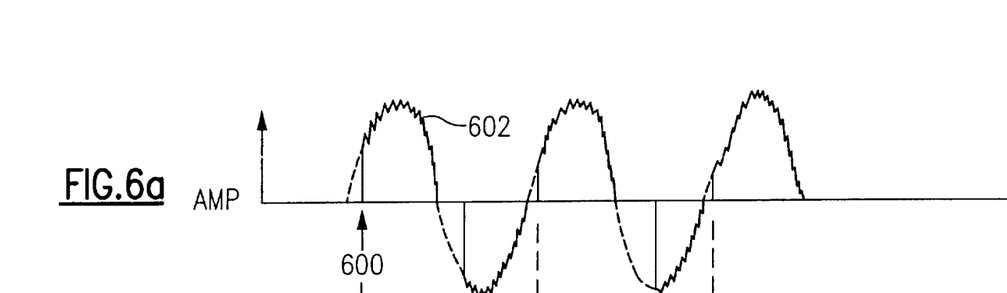
FIG. 6 illustrates waveforms of PWM and PPM arc fault detection.
Figure 6B:
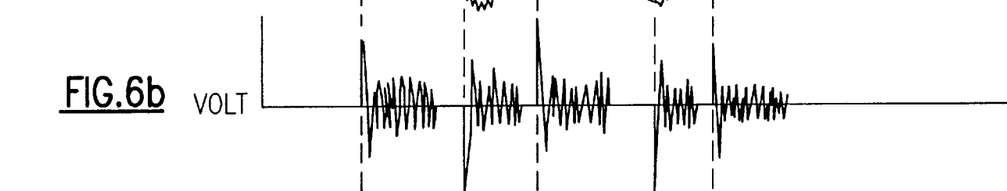
Figure 6C:
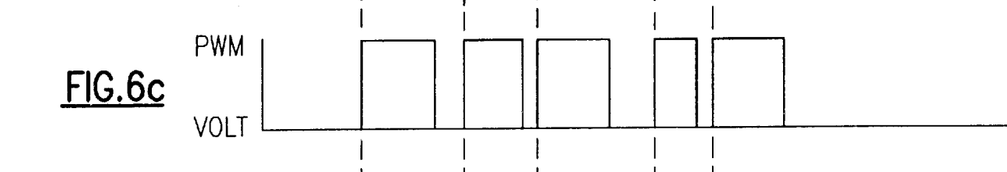
Figure 6D:
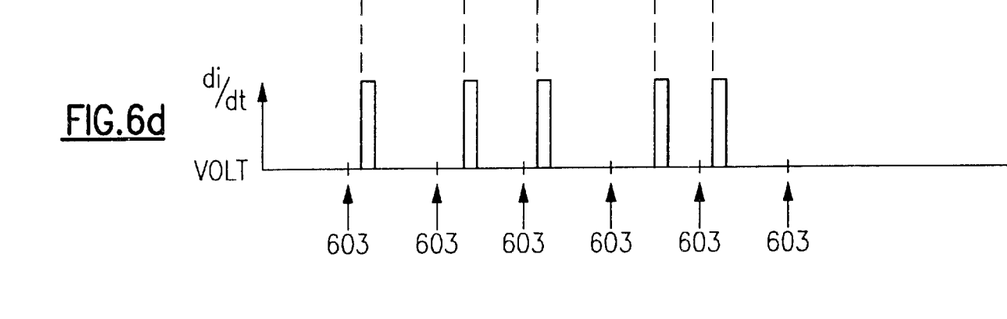

An analog implementation of PPM detection of arc faults is illustrated in FIG. 5. In this embodiment a current transformer 1 senses the broad band arc noise of the arc fault, which is passed through an amplifier and bandpass filter 12, and rectified by rectifier 500. At the start of the arc fault, the rectified arc noise at the output of rectifier 500, will trigger a timer 502 on the first arc voltage occurrence which exceeds the input trigger threshold of timer 502. The timer 502 is configured as a bistable timer, with a time out period of greater than one half line cycle, the timer could be replaced by a D type flip flop. During a positive half cycle of line voltage one input of AND gate 506 is enabled by a positive half cycle gate 526, which outputs a high logic pulse whenever the line voltage is positive over some predetermined threshold. Similarly, a negative half cycle gate 528 produces a high logic pulse whenever the line voltage is negative over some predetermined level. At the start of an arc fault, rectified arc noise will appear at the input to timer 502, triggering the timer, and producing a high output at 503. If the arc fault occurs during the positive portion of the line voltage, both inputs of AND gate 506 will be high and drive transistor 508 into conduction. Conduction of transistor 508 will cause a positive charge to flow into an integrator 514. At each zero cross, a zero cross pulse generator 524 outputs a pulse which resets timer 502. In this way, the integrator stores a charge proportional to the time between the start of the arc and the next voltage zero cross. On the next negative half cycle, if an arc fault occurs, timer 502 will again be triggered on the start of the arc noise. Both inputs to NAND gate 510 will now be high causing the output of the NAND gate to go low and cause transistor 512 to conduct. When transistor 512 conducts, a negative charge is stored by integrator 514. If the start of the arc in the positive hall cycle occurs at a different starting point than in the negative half cycle, then an unequal charge will be stored in integrator 514 causing a voltage to appear at the output of integrator 514. If the voltage at the input to comparators 516 and 518 exceeds either the positive or negative voltage references respectively of the comparators 516 and 518, an output voltage will appear at the input to a sample switch 520. At the start of each positive half cycle, pulse generator 530 activates sample switch 520 for a predetermined pulse period which causes a charge to flow into trip integrator 522. On the trailing edge of the pulse generator 530 a pulse discharge gate 534 is activated discharging integrator 514 in preparation of the next line cycle. Both the sample action and then discharge action are designed to act fast enough to occur before the start of the next arc fault step. If enough cycles of PPM modulation of the start of the arc fault, with respect to the zero cross, has occurred, then sample switch 520 passes sufficient charge from the comparator outputs to the trip integrator to fire SCR 41.

In still a further embodiment of the PPM detection, the degree of the arc fault start position variation, with respect to a power line zero cross, is compared to a sequence of increasing variation constants held in various memories in a microprocessor. An arc fault with a wildly varying arc fault start pulse position, with respect to the zero cross, is indicative of intense sputtering arcing. When the degree of arc fault start position variation, between successive arc fault starts, is equal to or greater than the lowest of variation constants, the predetermined trip value is lowered by a step. Similarly, if the pulse position variation time interval reaches a higher variation constant, the predetermined trip value is lowered in an even greater step. In this way, the PPM software counter quickly counts to the lowered predetermined trip value, which speedily causes the device to activate the circuit interrupter and interrupt the intense arcing.

FIGS. 6(a–d) illustrates some of the waveforms generated by the PWM and PPM embodiments. FIG. 6a illustrates the current waveform with the start of the arc shown at 600 and the superimposed broad band arc noise shown at 602. FIG. 6b illustrates the arc noise at the input to amp. and bandpass filter 12 shown in FIGS. 1 through 5. FIG. 6c is the comparator 16 output signal for the circuit of FIG. 1, which is pulse width modulated, and which forms the input signal to the microprocessor. FIG. 6d shows rectified di/dt pulses at the output of block 10 as used in the circuit of FIG. 4 and how the di/dt pulses arc pulse position modulated with respect to the zero cross pulses shown at 603.

What is claimed:

1. An arc fault detecting device for protecting electric power lines, the device comprising:

a sensor coupled to a power line for detecting broad band arc noise caused by an arc fault in the electric power lines;

a pulse generator connected to the sensor for generating an arc start pulse at the start of the broad band arc noise;

a power line zero cross detector generating a zero cross pulse;

a time interval generator connected to the zero cross detector which is triggered by the start of the zero cross pulse and which is reset by a transition of the arc start pulse, and which generates a time interval proportional to a delay time between the zero cross and the start of an arc;

a memory for storing the time interval;

a comparator connected to the time interval generator and the memory for comparing the delay time of a present arc start pulse with the delay time of a previous arc start pulse, wherein the delay times are of random duration corresponding to the broad band arc noise generated by the arc fault in the electric power lines;

a counter connected to the comparator, the counter being incremented if the difference between the present delay time and the previous delay time is greater than a first predetermined value; and a second comparator for generating an arc fault detection signal when the counter reaches a second predetermined value.

2. The arc fault detecting device of claim 1, in which the second predetermined value is determined by the magnitude of the arc fault noise.

3. The arc fault detecting device of claim 1, in which the second predetermined value is inversely proportional to the magnitude of the arc fault noise.

4. The arc fault detecting device of claim 1, in which the power line zero cross detector senses voltage zero crosses.

5. The arc fault detecting device of claim 1, in which the power line zero cross detector senses current zero crosses.

6. An arc fault detecting device for protecting electric power lines, the device comprising:

a sensor coupled to the power lines for detecting broad band arc noise caused by an arc fault in the electric power lines;

a pulse generator connected to the sensor for generating an arc start pulse at the start of the broad band arc noise;

a power line zero cross detector generating a zero cross pulse;

a timer width generator connected to the zero cross detector which is triggered by the start of the zero cross pulse and which is reset by an edge of the arc start pulse, and which generates a delay time interval;

a memory for storing the delay time interval;

a comparator connected to the timer and the memory for comparing the present delay time interval with a previous delay time interval, wherein the delay time intervals are of random duration corresponding to the broad band arc noise generated by the arc fault in the electric power lines;

a counter connected to the comparator, the counter being incremented if the difference between the present delay time interval and the previous delay time interval is greater than a first predetermined value;

a second comparator for generating an arc fault detection signal when the counter reaches a second predetermined value; and a third comparator for lowering the second predetermined value if the difference between the present time interval and the previous time interval is greater or less than a third predetermined value.

7. The arc fault detecting device of claim 6, in which the second predetermined value is determined by the magnitude of the arc fault noise.

8. The arc fault detecting device of claim 6, in which the second predetermined value is inversely proportional to the magnitude of the arc fault noise.

9. The arc fault detecting device of claim 6, in which the power line zero cross detector sense voltage zero crosses.

10. The arc fault detecting device of claim 6, in which the power line zero cross detector senses current zero crosses.

11. A method for protecting electric power lines from an arc fault, comprising the steps of:

sensing a load current;

determining a first time interval between a zero cross of a power frequency of said electric power lines and a start of a high frequency signal within said load current during said first interval;

determining a second time interval between a subsequent zero cross of said power frequency and a start of a subsequent high frequency signal with said load current during said second interval;

determining a number of instances wherein said second interval differs from said first interval by a predetermined amount; and producing an AFCI trip signal if said number of instances within a specified time period exceeds a predetermined number.

12. A device for protecting electric power lines from an arc fault, comprising:

means for sensing a load current;

means for determining a first time interval between a zero cross of a power frequency of said electric power lines and a start of a high frequency signal within said load current during said first interval;

means for determining a second time interval between a subsequent zero cross of said power frequency and a start of a subsequent high frequency signal with said load current during said second interval;

means for determining a number of instances wherein said second interval differs from said first interval by a predetermined amount; and means for producing an AFCI trip signal if said number of instances within a specified time period exceeds a predetermined number.

* * * * *